US008520440B2

(12) United States Patent
Ahn et al.

(10) Patent No.: US 8,520,440 B2
(45) Date of Patent: Aug. 27, 2013

(54) SEMICONDUCTOR MEMORY DEVICE AND METHOD OF OPERATING THE SAME

(75) Inventors: Jung Ryul Ahn, Namyangju-si (KR); Sang Hyun Oh, Anyang-si (KR); Jum Soo Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 149 days.

(21) Appl. No.: 13/297,467

(22) Filed: Nov. 16, 2011

(65) Prior Publication Data

US 2012/0120725 A1 May 17, 2012

(30) Foreign Application Priority Data

Nov. 17, 2010 (KR) ........................ 10-2010-0114396

(51) Int. Cl.
*G11C 16/04* (2006.01)

(52) U.S. Cl.
USPC .................................. 365/185.2; 365/185.17

(58) Field of Classification Search
USPC .............................. 365/185.2, 185.17, 185.18
See application file for complete search history.

(56) References Cited

U.S. PATENT DOCUMENTS

| 7,643,345 B2 * | 1/2010 | Ishibashi .................. 365/185.13 |
| 2010/0187593 A1 * | 7/2010 | Morikado ..................... 257/316 |

FOREIGN PATENT DOCUMENTS

| KR | 1020070035361 A | 3/2007 |
| KR | 10-2008-0005765 A | 1/2008 |
| KR | 1020090104449 A | 10/2009 |

* cited by examiner

*Primary Examiner* — Vu Le
(74) *Attorney, Agent, or Firm* — William Park & Associates Patent Ltd.

(57) ABSTRACT

A method of operating a semiconductor memory device includes a memory array having memory cell strings including a first and a second memory cell groups having memory cells, a first and a second dummy elements, a drain select transistor and a source select transistor, wherein the first memory cell group and the second memory cell group are arranged between the drain select transistor and the source select transistor; connecting electrically the first memory cell group to the second memory cell group during a program operation or a read operation of the first memory cell group or the second memory cell group; and performing separately an erase operation of the first memory cell group and an erase operation of the second memory cell group, selecting simultaneously one of the first dummy element and the second dummy element during the erase operation of the selected memory cell group.

15 Claims, 7 Drawing Sheets

SEMICONDUCTOR MEMORY DEVICE AND METHOD OF OPERATING THE SAME

CROSS-REFERENCE TO RELATED APPLICATIONS

This application claims priority from Korean Patent Application No. 10-2010-0114396, filed on Nov. 17, 2010, the contents of which are incorporated herein by reference in its entirety.

BACKGROUND OF THE INVENTION

The present invention relates generally to a semiconductor memory device and a method of operating the same, more particularly relates to a nonvolatile memory device such as a NAND flash memory device.

A memory array in a semiconductor memory device such as a NAND flash memory device includes memory blocks, and each of the memory blocks has plural memory cell strings connected between a common source line and a bit line. Hereinafter, a known NAND flash memory device will be described in detail with reference to accompanying FIG. 1 and FIG. 2.

FIG. 1 is a view illustrating circuit for describing a part of the known NAND flash memory device, and FIG. 2 is a sectional view illustrating schematically a memory cell string of the NAND flash memory device in FIG. 1.

As shown in FIG. 1, the NAND flash memory device includes a memory array 10 having memory cells C[a0:kn] for storing data and a block switch circuit 15 for transferring operation voltages to a selected memory block in the memory array 10.

Referring to FIGS. 1 and 2, the memory array 10 includes a plurality of memory blocks. Only one memory block is shown in FIG. 1. Each of the memory blocks has plural memory cell strings ST[0:k] connected between a common source line SL and bit lines BL[0:k]. Each of the memory cell strings, e.g. ST0 includes a source select transistor SST connected to the common source line SL, a drain select transistor DST connected to the bit line BL0 and memory cells C[a0:an] connected in series between the source select transistor SST and the drain select transistor DST. A gate of the source select transistor SST is connected to a source select line SSL formed over a gate insulating layer 27. A gate of the drain select transistor DST is connected to a drain select line DSL formed over a gate insulating layer 27. The gate insulating layer 27 is formed on the semiconductor substrate 21. Each of the memory cells C[a0:an] comprises the gate insulating layer 27 used as a tunnel insulating layer, a floating gate FG, a dielectric layer 29 and a control gate CG. Here, the gate insulating layer 27 is formed on the semiconductor substrate 21, and the floating gate FG is formed on the gate insulating layer 27, and the dielectric layer 29 is formed on the floating gate FG, and the control gate CG is formed on the dielectric layer 29. The source select line SSL may be formed by using the same conducting layer as the control gate CG, and be connected electrically to a lower layer, which is formed between the source select line SSL and the gate insulating layer 27 and is formed by using the same layer as the floating gate FG, through a contact hole in the dielectric layer 29. The drain select line DSL may be formed by using the same conducting layer as the control gate CG, and be connected electrically to a lower layer, which is formed between the drain select line DSL and the gate insulating layer 27 and is formed by using the same layer as the floating gate FG, through the contact hole in the dielectric layer 29.

The source select transistor SST, the memory cells C[a0:an] and the drain select transistor DST can be electrically connected in series through impurity areas 21S, 21C and 21D formed in the semiconductor substrate 21. The impurity areas includes a source area 21S and a drain area 21D of a memory cell string and cell connection areas 21C. Here, the source area 21S is connected to the common source line SL and the drain area 21D is connected to drain contact DCT. Also, the cell connection areas 21C are formed between gates of the source select transistor SST and an adjacent memory cell Ca0, between each of the memory cells C[a0:an] and between the drain select transistor DST and an adjacent memory cell Can. The drain area 21D may be connected to the bit line BL0 via the drain contact DCT. Insulating layers 23 and 25 are formed between patterns which need to be insulated electrically.

The memory cell strings ST[0:k] in the memory block are connected commonly to the common source line SL, and are arranged in parallel. The memory cell strings ST[0:k] are connected to corresponding bit line BL[0:k], respectively. Gates of the source select transistors SST are connected commonly to the source select line SSL one of a memory block. In addition, gates of the drain select transistors DST are connected commonly to the drain select line DSL of the memory block. Gate of each memory cell C[a0:kn] is connected to corresponding word line WL[0:n], respectively. The source select line SSL, the drain select line DSL and the word lines WL[0:n] connected to the memory array 10 are referred to as local lines.

The block switch circuit 15 applies operation voltages provided through global lines GDSL, GWL[0:n] and GSSL to the local lines DSL, WL[0:n] and SSL of a selected memory block in response to a block select signal BLKSW. The block switch circuit 15 is connected between the global lines GDSL, GWL[0:n] and GSSL and the local lines DSL, WL[0:n] and SSL for the purpose of applying the operation voltages. Additionally, the block switching circuit 15 includes pass transistors NS, N[0:n] and ND driven in response to the block select signal BLKSW. The block select signal BLKSW is enabled in response to row address signals of the control circuit. The operation voltages are generated by a voltage generating circuit, and are provided to the global lines GDSL, GWL[0:n] and GSSL.

High integration of the NAND flash memory device may be achieved by reducing size of the memory cells C[a0:kn] in the memory cell string. However, it is difficult to reduce size of the drain select transistor DST and the source select transistor SST for selecting the memory cell string by size of the memory cells C[a0:kn]. Therefore, high integration of the NAND flash memory device may also be achieved by increasing the number of the memory cells C[a0:an] in the memory cell string ST0. In case of increasing the number of the memory cells in each of the memory cell strings, the number of the drain select transistor DST and the source select transistor SST in a whole memory device may be reduced, but the size of the memory block, i.e., the number of the memory cells in each memory block increases. Since the size of the memory block is limited to the size supported by the control circuit of the NAND flash memory device, it is limited to increase the number of the memory cells in the memory cell string. On the other hand, a method of increasing the number of the memory cell strings may be used as an alternative method for highly integrated NAND flash memory device. In this case, the number of the drain select transistor DST and the source select transistor SST increases. Since it is difficult to reduce the size of the drain select transistor DST and the source select transistor SST by the size of the memory cells C[a0:*kn*], the size of a chip may increase as the number of the drain select transistor DST and the source select transistor SST increases.

SUMMARY OF THE INVENTION

Exemplary embodiments of the present invention provide a semiconductor memory device which can limit the number of a memory cell erased in an erase operation among the memory cells in a memory cell string according to the range limited by a control circuit through a method of dividing the memory cells in the memory cell string into memory cell groups and performing selectively the erase operation in the unit of the group, and a method of operating the same.

Exemplary embodiments of the present invention also provide a semiconductor memory device for improving reliability of the memory cell in an erase operation by forming dummy elements at a boundary of the memory cell groups, applying an erase operation voltage to a gate of a dummy element adjacent to a selected memory cell group during an erase operation of the selected memory cell group and floating a gate of the dummy element adjacent to the memory cell group not selected, and a method of operating the same.

A NAND flash memory device according to an embodiment of the present invention includes a memory array configured to have memory cell strings including a first memory cell group having memory cells connected in series; a second memory cell group which is not selected in case that the first memory cell group is selected for an erase operation, selected in case that the first memory cell group is not selected and performs an erase operation, and has memory cells connected in series; a first and a second dummy elements connected in series between the first memory cell group and the second memory cell group and for connecting the first memory cell group to the second memory cell group during a program operation or a read operation of a selected memory cell; and a drain select transistor and a source select transistor connected to the first memory cell group and the second memory cell group, the first memory cell group and the second memory cell group being disposed between the drain select transistor and the source select transistor. Here, one of the first dummy element and the second dummy element adjacent to the selected memory cell group is selected during the erase operation of one selected from the first memory cell group and the second memory cell group.

A method of operating a NAND flash memory device according to an embodiment of the present invention includes providing a memory array having memory cell strings including a first and a second memory cell groups having memory cells connected in series, a first and a second dummy elements connected in series between the first memory cell group and the second memory cell group, a drain select transistor and a source select transistor connected to the first memory cell group and the second memory cell group, the first memory cell group and the second memory cell group locating between the drain select transistor and the source select transistor; connecting electrically the first memory cell group to the second memory cell group by operation of the first dummy element and the second dummy element during a program operation or a read operation of the first memory cell group or the second memory cell group; and performing separately an erase operation of the first memory cell group and an erase operation of the second memory cell group in an erase operation of the memory array, selecting simultaneously one of the first dummy element and the second dummy element adjacent to a selected memory cell group during the erase operation of the selected memory cell group.

A NAND flash memory device of the present invention limits the number of a memory cell erased in a memory block in the range limited by a control circuit through a method of dividing the memory cells in a memory cell string into memory cell groups and performing an erase operation in the unit of the group, and thus degree of integration of the flash memory device may be enhanced by increasing the number of memory cells in the memory block.

A NAND flash memory device of the present invention disposes dummy elements at a boundary of the memory cell groups, applies an erase operation voltage to a dummy element adjacent to a selected memory cell group during an erase operation of the selected memory cell group and floats a dummy line of a dummy element adjacent to the memory cell group not selected, and hot-carrier is injected to the dummy element not the memory cell. As a result, reliability of the memory cell may be improved.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
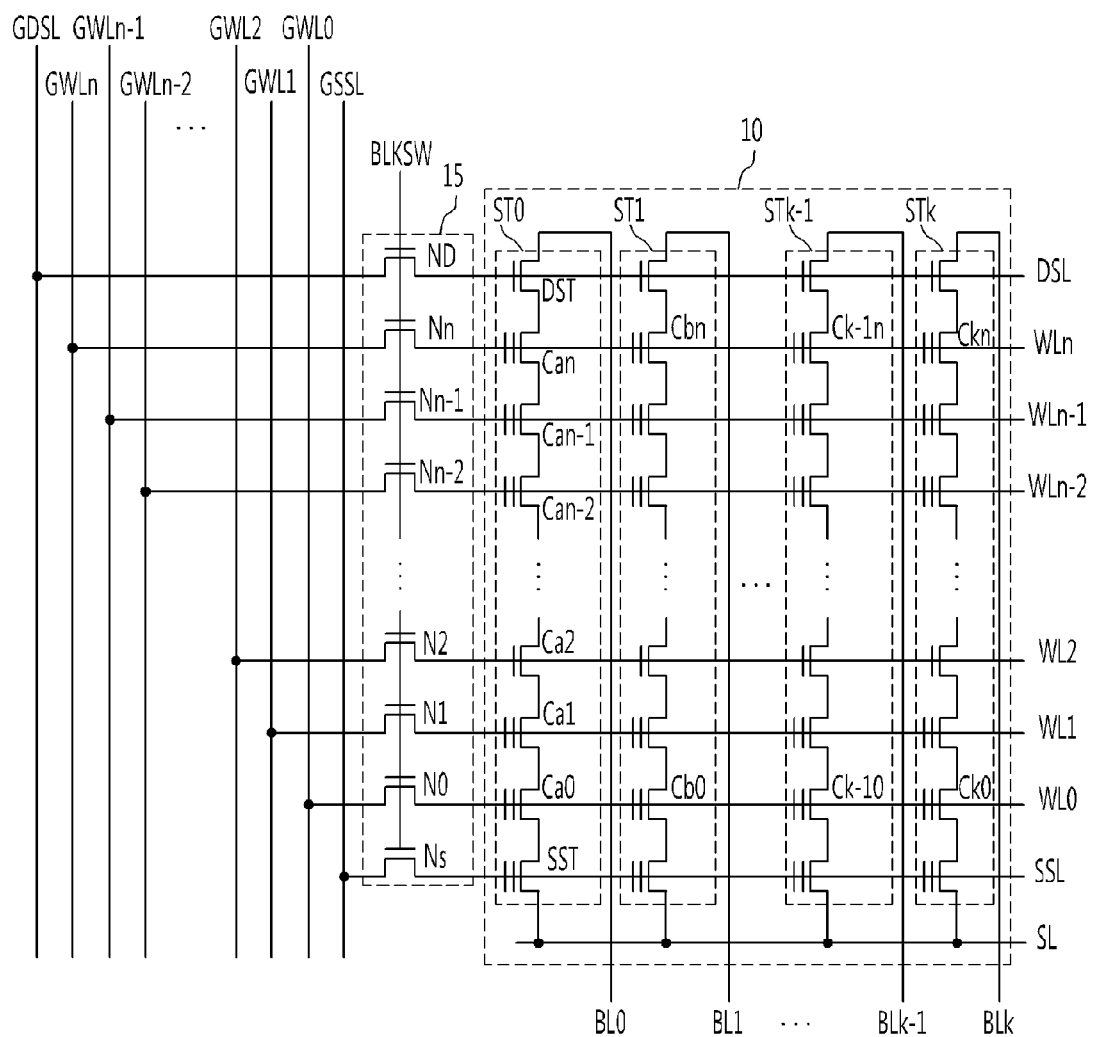
FIG. 1 is a view illustrating circuit for describing a part of a known NAND flash memory device.
Figure 2:
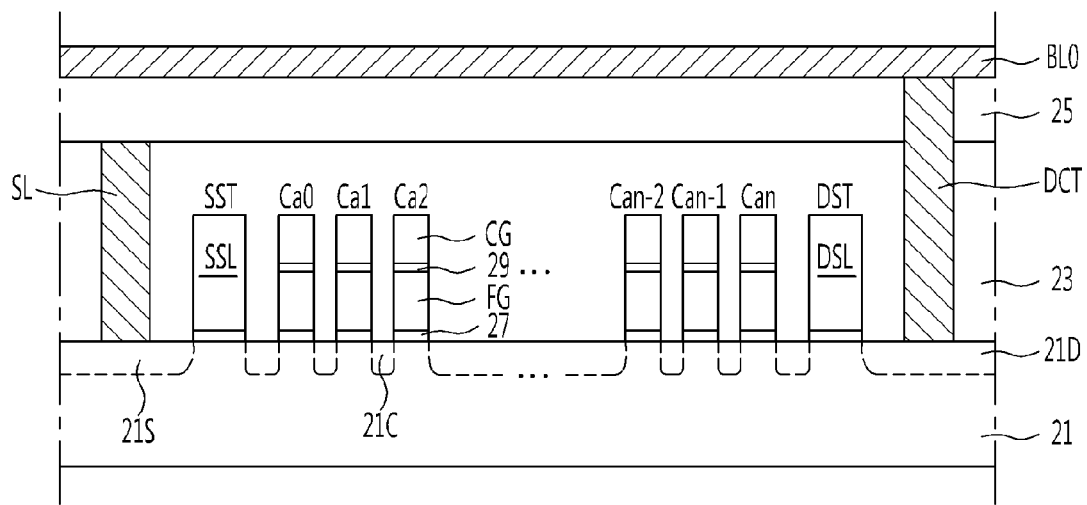
FIG. 2 is a sectional view illustrating schematically a memory cell string of the NAND flash memory device in FIG. 1.
Figure 3:
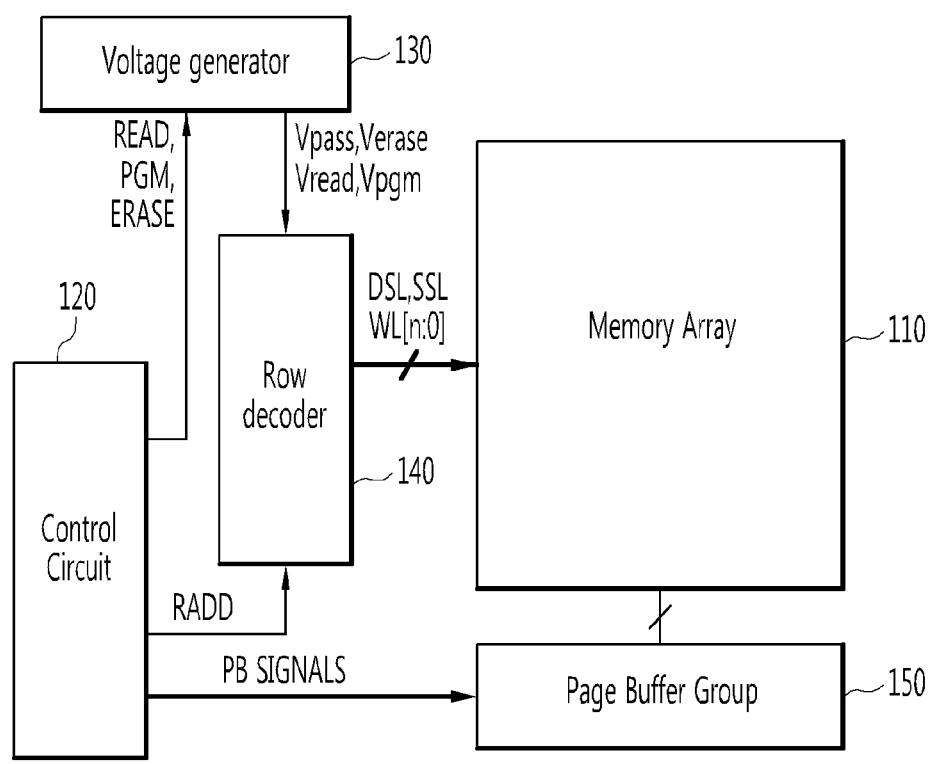
FIG. 3 is a block diagram illustrating a semiconductor memory device according to an embodiment of the present invention.

FIG. 3 is a block diagram illustrating a semiconductor memory device according to an embodiment of the present invention.

In FIG. 3, a semiconductor memory device of an embodiment of the present invention includes a memory array 110, an operation circuit group 130, 140 and 150 for performing an erase operation, a program operation or a read operation of memory cells in the memory array 110, and a control circuit 120 for controlling the operation circuit group 130, 140 and 150 to set threshold voltages levels of selected memory cells to one level of erase level and program levels in accordance with inputted data. The operation circuit group has a voltage supplying circuit 130 and 140 and a page buffer group 150.

The memory array 110 includes plural memory blocks. Each of the memory blocks has memory cells which are connected to a local word line and a bit line and store data. Also, each of the memory blocks has a dummy element which is connected to a local dummy line and prevents operation error of the memory cell in the erase operation.

The control circuit 120 outputs internally a program operation signal PGM, a read operation signal READ or an erase operation signal ERASE in response to a command signal, and outputs control signals PB SIGNALS for controlling page buffers included in the page buffer group 150 in accordance with the kind of the operation. In addition, the control circuit 120 outputs internally a row address signal RADD.

The voltage supplying circuits 130 and 140 provide operation voltages needed for the program operation, the erase operation or the read operation of the memory cells to a selected memory block in accordance with the signals READ, PGM, ERASE and RADD of the control circuit 120. The voltage supplying circuit includes a voltage generator 130 and a row decoder 140.

The voltage generator 130 outputs the operation voltages used for programming, reading or erasing the memory cells to global lines in response to the operation signal PGM, READ or ERASE which is an internal command signal of the control circuit 120.

The row decoder 140 transfers the operation voltages outputted from the voltage generator 130 to a selected memory block of the memory blocks of the memory array 110 in response to the row address signals RADD of the control circuit 120.

The page buffer group 150 includes page buffers (not shown) which are connected to bit lines BL[0:$k$], respectively. The page buffer group 150 provides a voltage needed for storing data of the memory cells to the bit lines BL[0:$k$] in response to the control signals PB SIGNALS of the control circuit 120.

The voltage generator 130 outputs the operation voltages Vpass, Verase, Vread and Vpgm needed for operation of the memory cells to the global lines in response to the program operation signal PGM, the read operation signal READ or the erase operation signal ERASE of the control circuit 120. The row decoder 140 provides the operation voltages Vpass, Verase, Vread and Vpgm to local lines of the selected memory block of the memory blocks in the memory array 110 in response to the row address signals RADD of the control circuit 120.

Hereinafter, the semiconductor memory devices of the present invention will be described in detail with reference to accompanying drawings FIG. 4 to FIG. 6.

Figure 4:
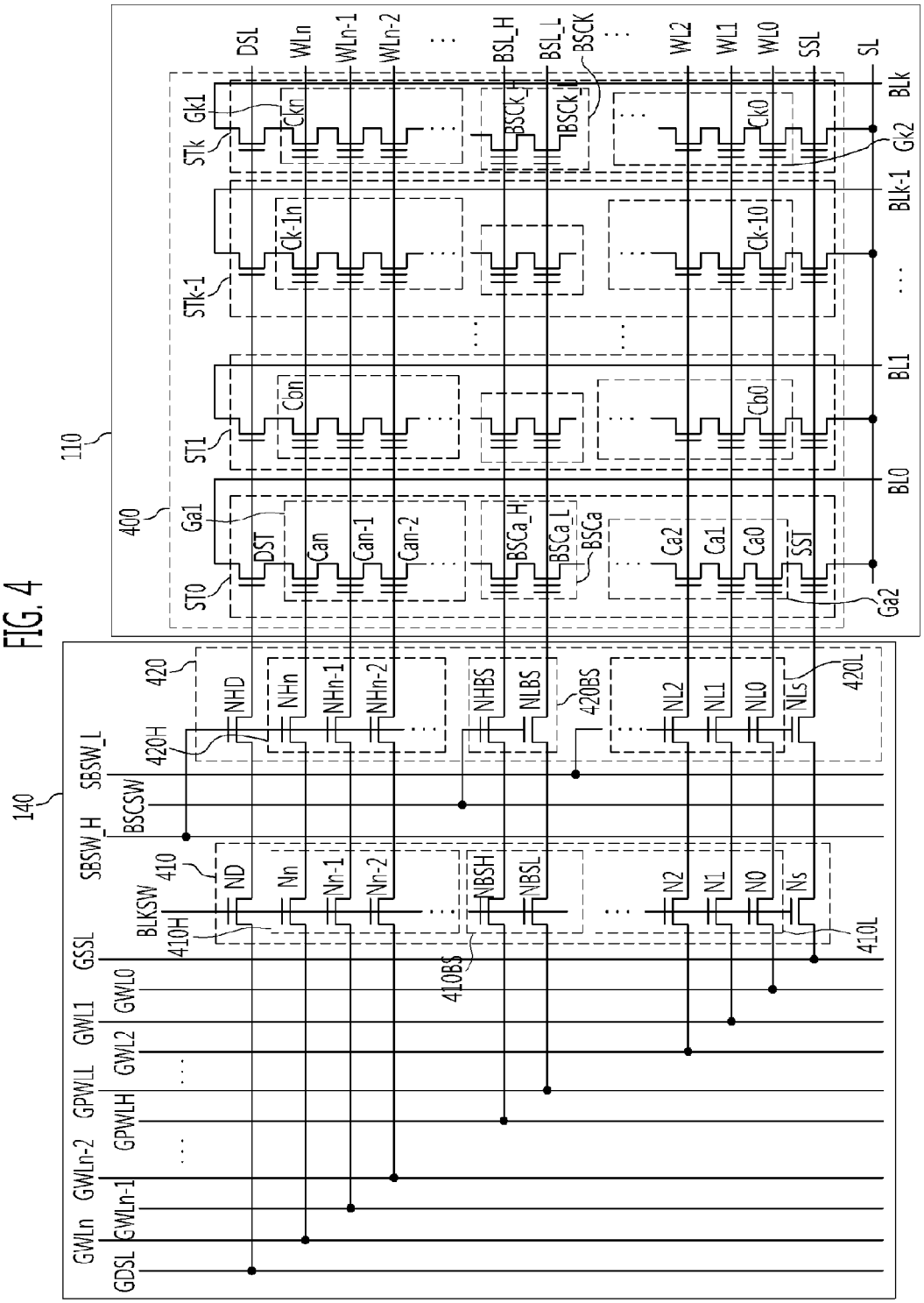
FIG. 4 is a view illustrating circuit for describing configuration of a row decoder and a memory block in a semiconductor memory device according to an embodiment of the present invention.

FIG. 4 is a view illustrating circuit for describing configuration of a row decoder and a memory block in the semiconductor memory device according to an embodiment of the present invention.

In FIG. 4, each of memory blocks 400 of the memory array 110 in the semiconductor memory device of an embodiment of the present invention includes plural memory cell strings ST[0:$k$] connected between a common source line SL and the bit lines BL[0:$k$]. Each of the memory cell strings, e.g. ST0 has a source select transistor SST connected to the common source line SL, a drain select transistor DST connected to the bit line BL0, a first and a second memory cell groups Ga1 and Ga2 connected in series between the source select transistor SST and the drain select transistor DST, and at least one dummy element BSCa_H or BSCa_L connected in series between the memory cell groups Ga1 and Ga2. The dummy element may reduce a probability of operation error of the semiconductor memory device by preventing a phenomenon that hot-carriers generated during the erase operation are injected into the memory cell included in the first and the second memory cell groups G[a1:k1] and G[a2:k2]. To reduce the probability of the operation error, the dummy element of an embodiment of the present invention is connected to the memory cell groups Ga1 and Ga2 of the memory cell string ST0. The dummy element may include a first dummy element BSCa_H connected to the first memory cell group Ga1 of the memory cell string ST0 and a second dummy element BSCa_L connected to the second memory cell group Ga2 of the memory cell string ST0. The first memory cell group Ga1 has memory cells Can, Can-1, Can-2 . . . connected in series to the drain select transistor DST, and the second memory cell group Ga2 has memory cells Ca0, Ca1, Ca2, . . . connected in series to the source select transistor SST. In case that the number of the memory cells C[a0:$an$] included in each of the memory cell strings, e.g. ST0 equals to 128, i.e. n=127, the first memory cell group Ga1 may include 64 memory cells adjacent to the drain select transistor DST and the second memory cell group Ga2 may have 64 memory cells adjacent to the source select transistor SST.

Sum of the number of the memory cells included in the first memory cell group G[a1:k1] and the number of the first dummy elements Can:BSCk_H in the memory block 400 is limited in the range controllable by the control circuit during the erase operation. Furthermore, Sum of the number of the memory cells included in the second memory cell group G[a2:k2] and the number of the second dummy elements Ca0:BSCk_L in the memory block 400 is limited in the range controllable by the control circuit during the erase operation. Accordingly, the physical number of the memory cells included in the memory block 400 is higher than the range controllable by the control circuit during the erase operation. The semiconductor memory device of an embodiment of the present invention does not perform the erase operation in the unit of the memory block, but performs separately a first erase operation for the first memory cell groups G[a1:k1] and the first dummy elements BSCa_H:BSCk_H and a second erase operation for the second memory cell groups G[a2:k2] and the second dummy elements BSCa_L:BSCk_L. Since the semiconductor memory device of the present invention groups the memory cells in the memory block 400 so as to meet the range limited by the control circuit and performs corresponding erase operation in the unit of group, the physical number of the memory cells in the memory cell string may be larger than the range limited by the control circuit.

The memory cell strings ST[0:$k$] in the memory block 400 are connected commonly to the common source line SL, and are arranged in parallel one another. Each of the memory cell strings ST[0:$k$] is connected to corresponding bit line, i.e. one of BL[0:$k$]. Gates of the source select transistors SST in a memory block 400 are connected commonly to the source select line SSL. Gates of the drain select transistors DST in the memory block 400 are connected commonly to the drain select line DSL. Additionally, gates of the memory cells C[a0:$kn$] are connected to word lines WL[0:$n$]. The word lines WL[0:$n$] are divided into a first word line group connected to the first memory cell group G[a1:k1] and a second word line group connected to the second memory cell group G[a2:k2]. The first dummy elements BSC[a_H:k_L] arranged in series are connected to a first dummy line BSL_H, and the second dummy elements BSC[a_L:k_L] arranged in series are connected to a second dummy line BSL_L. Hereinafter, the source select line SSL, the drain select line DSL, the word lines WL[0:n] and the dummy lines BSL_H and BSL_L connected to the memory array 110 will be referred to as local lines.

The row decoder 140 of an embodiment of the present invention includes a block switch 410 and a sub-block switch 420 connected between global lines GSSL, GWL[0:n], GPWLL, GPWLH and GDSL and the local lines SSL, WL[0:n], BSL_L, BSL_H and DSL.

The block switch 410 outputs the operation voltages provided through the global lines GSSL, GWL[0:n], GPWLL, GPWLH and GDSL in response to a block select signal BLKSW. More particularly, the block switch 410 may output the operation voltages provided through the global lines GSSL, GWL[0:n], GPWLL, GPWLH and GDSL by using a drain pass transistor ND, a first select circuit 410H, a dummy select circuit 410BS, a second select circuit 410L and a source pass transistor NS. The drain pass transistor ND outputs the operation voltage provided through a global drain select line GDSL in response to the block select signal BLKSW. The first select circuit 410H outputs the operation voltages provided through first global word lines GWLn, GWLn-1, GWLn-2, ... in response to the block select signal BLKSW. The first select circuit 410H may have pass transistors Nn, Nn-1, Nn-2, ... which are connected to the first global word lines GWLn, GWLn-1, GWLn-2, ... and operate in response to the block select signal BLKSW. The dummy select circuit 410BS outputs the operation voltages provided through a first and a second global dummy lines GPWLH and GPWLL in response to the block select signal BLKSW. The dummy select circuit 410BS may include a first dummy pass transistor NHBS which is connected to the first global dummy line GPWLH and operates in response to the block select signal BLKSW and a second dummy pass transistor NLBS which is connected to the second global dummy line GPWLL and operates in response to the block select signal BLKSW. The source pass transistor NS outputs the operation voltage provided through a global source select line GSSL in response to the block select signal BLKSW.

The sub-block switch 420 provides the operation voltages outputted through the block switch 410 to the local lines DSL, WL[n:0], BSL_H, BSL_L and SSL. More particularly, the sub-block switch 420 may provide the operation voltages outputted from the block switch 410 to the local lines DSL, WL[n:0], BSL_H, BSL_L and SSL by using a sub-drain pass transistor NHD, a first sub-select circuit 420H, a sub-dummy select circuit 420BS, a second sub-select circuit 420L and a sub-source pass transistor NLS. The sub-drain pass transistor NHD provides the operation voltage outputted through the drain pass transistor ND to the drain select line DSL in response to a first sub-select signal SBSW_H. The first sub-select circuit 420H provides the operation voltages outputted from the first select circuit 410H to the word lines WLn, WLn-1, WLn-2, ... of the first memory cell group in response to the first sub-select signal SBSW_H. The first sub-select circuit 420H may have pass transistors NHn, NHn-1, NHn-2, ... which are connected between the first select circuit 410H and the word lines WLn, WLn-1, WLn-2, ... of the first memory cell group and operate in response to the first sub-select signal SBSW_H. The sub-dummy select circuit 420BS provides the operation voltage of the first global dummy line GPWLH outputted from the dummy select circuit 410BS to the first dummy line BSL_H connected to the first dummy element in response to a sub-dummy select signal BSCSW, and provides the operation voltage of the second global dummy line GPWLL outputted from the dummy select circuit 410BS to the second dummy line BSL_L connected to the second dummy element in response to the sub-dummy select signal BSCSW. The sub-dummy select circuit 420BS may include a first sub-dummy pass transistor NHBS connected between the first dummy pass transistor NBSH and the first dummy line BSL_H and a second sub-dummy pass transistor NLBS connected between the second dummy pass transistor NBSL and the second dummy line BSL_L. Though the first sub-dummy pass transistor NHBS and the second sub-dummy pass transistor NLBS operate in response to the same sub-dummy select signal BSCSW, the semiconductor memory device may control differently operation of the first dummy element BSCa_H and the second dummy element BSCa_L by controlling the voltages provided to the first and the second global dummy lines GPWLH and GPWLL. The second sub-select circuit 420L provides the operation voltages outputted from the second select circuit 410L to the word lines WL0, WL1, WL2, ... of the second memory cell group in response to a second sub-select signal SBSW_L. The second sub-select circuit 420L may includes pass transistors NL0, NL1, NL2, ... which are connected between the second select circuit 410L and the word lines WL0, WL1, WL2, ... of the second memory cell group and operate in response to the second sub-select signal SBSW_L. The sub-source pass transistor NLS provides the operation voltage outputted from the source pass transistor NS to the source select line SSL in response to the second sub-select signal SBSW_L.

The semiconductor memory device of an embodiment of the present invention may select the word lines WLn, WLn-1, WLn-2, ... of the first memory cell group by using the first select circuit 410H of the block switch 410 and the first sub-select circuit 420H of the sub-block switch 420. Additionally, the semiconductor memory device may select one of the first dummy element BSCa_H and the second dummy element BSCa_L using the dummy select circuit 410BS of the block switch 410 and the sub-dummy select circuit 420BS of the sub-block switch 420. The semiconductor memory device may select the word lines WL0, WL1, WL2, ... of the second memory cell group using the second select circuit 410L of the block switch 410 and the second sub-select circuit 420L of the sub-block switch 420.

In addition, the sub-block switch 420 applies the erase operation voltage provided from the block switch 410 to the selected memory cell group and the selected dummy element during the erase operation, and floats word lines of the memory cell group not selected and the dummy line connected to the dummy element not selected.

The sub-drain pass transistor NHD of the sub-block switch 420 and the pass transistors NHn, NHn-1, NHn-2, ... of the first sub-select circuit 420H are turned off during an operation in which the memory block 400 is not selected, and are turned on during an operation in which the memory block 400 is selected for the read operation or the program operation.

The sub-drain pass transistor NHD and the pass transistors NHn, NHn-1, NHn-2, ... of the first sub-select circuit 420H are turned on when the first erase operation for the first memory cell group is performed, and are turned off when the second erase operation for the second memory cell group is performed. As a result, in the first erase operation, the word lines WLn, WLn-1, WLn-2, ... of the first memory cell group are selected, and the erase operation voltage is applied to the word lines WLn, WLn-1, WLn-2, ... of the first memory cell group. However, in the first erase operation, the word lines WL0, WL1, WL2, ... of the second memory cell group are not selected, and the word lines WL0, WL1, WL2, ... of the second memory cell group are floating. In the second erase operation, the word lines WL0, WL1, WL2, ... of the second memory cell group are selected, and the erase operation voltage is provided to the word lines WL0, WL1, WL2, ... of the second memory cell group. However, in the second erase operation, the word lines WLn, WLn-1, WLn-2, ... of the first memory cell group are not selected, and the word lines WLn, WLn-1, WLn-2, ... of the first memory cell group are floating.

The first and the second dummy pass transistors NHBS and NLBS are turned off during an operation in which the memory block 400 is not selected, and are turned on during an operation in which the memory block 400 is selected for the read operation or the program operation. The first sub-dummy pass transistor NHBS is turned on when the first memory cell group is selected to perform the first erase operation of the first memory cell group, and is turned off when the second memory cell group is selected to perform the second erase operation of the second memory cell group. The second dummy pass transistor NLBS is turned off when the first memory cell group is selected to perform the first erase operation of the first memory cell group, and is turned on when the second memory cell group is selected to perform the second erase operation of the second memory cell group. Accordingly, the first dummy element BSCa_H adjacent to the selected first memory cell group is selected in the first erase operation, and the same erase operation voltage as the erase operation voltage provided to the word lines WLn, WLn-1, WLn-2, ... of the first memory cell group is applied to the first dummy element BSCa_H. The second dummy element BSCa_L adjacent to the second memory cell group not selected is not selected in the first erase operation, and the second dummy line BSL_L is floating like the word lines WL0, WL1, WL2, ... of the second memory cell group. Whereas, the second dummy element BSCa_L adjacent to the selected second memory cell group is selected in the second erase operation, and the same erase operation voltage as the erase operation voltage provided to the word lines WL0, WL1, WL2, ... of the second memory cell group is applied to the second dummy element BSCa_L. The first dummy element BSCa_H adjacent to the first memory cell group not selected is not selected in the second erase operation, and the first dummy line BSL_H is floating like the word lines WLn, WLn-1, WLn-2, ... of the first memory cell group.

Hereinafter, operation of the semiconductor memory device of an embodiment of the present invention will be described with reference to accompanying Table 1 and Table 2. Table 1 shows voltages applied to the selected memory block when a known NAND flash memory device operates, and Table 2 illustrates voltages provided to the selected memory block when the semiconductor memory device of an embodiment of the present invention operates.

TABLE 1

|  |  |  | Program operation | Read operation | Erase operation |
|---|---|---|---|---|---|
| Memory block |  | DSL | Vcc | Vcc | Floating |
|  |  | SSL | 0 V | Vcc | Floating |
|  | WL | Sel WL | Vpgm | Vread | 0 V |
|  |  | Un-sel WL | Vpass | Vpass |  |
|  |  | BL | Vcc | Vcc | Floating |
|  |  | SL | Vcc | 0 V | Floating |
|  |  | Well | 0 V | 0 V | Verase |

TABLE 2

|  |  |  | Program operation | Read operation | Erase operation |
|---|---|---|---|---|---|
| Memory block |  | DSL | Vcc | Vcc | Floating |
|  |  | SSL | 0 V | Vcc | Floating |
|  |  | BL | Vcc | Vcc | Floating |
|  |  | SL | Vcc | 0 V | Floating |
|  |  | Well | 0 V | 0 V | Verase |
| First memory cell group | WL | Sel | Vpgm | Vread | 0 V |
|  |  | Un-sel | Vpass | Vpass |  |
|  | BSC_H |  | Vpass | Vpass | 0 V |
|  | BSC_L |  | Vpass | Vpass | Floating |
| Second memory cell group | WL | Sel | Vpgm | Vread | Floating |
|  |  | Un-sel | Vpass | Vpass |  |

Referring to Table 1, in the erase operation of the known NAND flash memory device, an erase operation voltage of 0V is applied to every word line in the memory block, and an erase voltage Verase, e.g. high voltage of 20V is provided to a well on a substrate of the memory cell array. As a result, charges of every memory cell in the memory block are discharged to the substrate due to voltage difference between the memory cells in the memory block and the substrate during the erase operation, and threshold voltage of every memory cell in the memory block may become low to an erase level. Word lines in the memory block not selected are floating during the erase operation, which is not shown in Table 1.

Whereas, the semiconductor memory device of an embodiment of the present invention divides the memory cells in the memory block into the first memory cell group and the second memory cell group, and then performs separately the erase operations. For example, the erase operation voltage of 0V is applied to the word lines of the first memory cell group during the first erase operation of the first memory cell group as shown in Table 1, and the word lines of the second memory cell group are floating. In order to apply the erase operation voltage of 0V to the word lines of the first memory cell group and float the word lines of the second memory cell group during the first erase operation, the sub-pass transistors of the first sub-select circuit are turned on and the sub-pass transistors of the second sub-select circuit are turned off. In addition, high voltage, e.g. 20V is provided to the well on the substrate of the memory cell array during the first erase operation. Accordingly, charges of the first memory cell group is discharged to the substrate due to voltage difference between the first memory cell group and the substrate in the first erase operation, and threshold voltage of the first memory cell group may become low to an erase level. However, since the word lines of the second memory cell group are floating, voltage of the word lines of the second memory cell group increases due to coupling phenomenon in case that the high voltage is applied to the well, and thus the second memory cell group is not erased.

The erase operation voltage of 0V is applied to the word lines of the second memory cell group during the second erase operation of the second memory cell group and the word lines of the first memory cell group are floating, which is not shown in Table 2. In order to apply the erase operation voltage of 0V to the word lines of the second memory cell group and float the word lines of the first memory cell group during the second erase operation, the sub-pass transistors of the second sub-select circuit are turned on and the sub-pass transistors of the first sub-select circuit are turned off. Furthermore, high voltage, e.g. 20V is provided to the well on the substrate of the memory cell array during the second erase operation. Accordingly, charges of the second memory cell group is discharged to the substrate due to voltage difference between the second memory cell group and the substrate in the second erase operation, and threshold voltage of the second memory cell group may become low to the erase level. However, since the word lines of the first memory cell group are floating, voltage of the word lines of the first memory cell group increases due to coupling phenomenon in case that the high voltage is applied to the well, and thus the first memory cell group is not erased.

As described above, the semiconductor memory device according to an embodiment of the present invention divides the memory cells in the memory block into the memory cell groups and performs separately the first erase operation and the second erase operation for the memory cell groups, and thus the number of the memory cell in the memory block erased by an erase operation may be adjusted in the range limited by the control circuit though physical number of the memory cells in the memory block increases. Accordingly, it is possible to achieve more highly integrated semiconductor memory.

High voltage applied to the well of the substrate in the first erase operation or the second erase operation is discharged after certain period of time elapses. Here, in case that the dummy elements do not exist between the first memory cell group and the second memory cell group and the memory cell groups are adjacently arranged, operation error of the memory cell may occur due to hot-carrier. The hot-carrier is generated from a channel of the memory cell connected to the word line to which the erase operation voltage of 0V is applied because the voltage of the floated word line is not discharged rapidly when the high voltage applied to the well of the substrate during the first erase operation or the second erase operation is discharged after certain period of time elapses. The hot-carrier may be injected into the memory cell connected to the floated word line due to potential of the floated word line not discharged, and operation error for programming the memory cell connected to the floated word line may occur. As described above, the operation error due to the hot-carrier in the first erase operation or the second erase operation occurs at the memory cell adjacent to a boundary of the first memory cell group and the second memory cell group. Accordingly, in the semiconductor memory device of an embodiment of the present invention, the first dummy element and the second dummy element is formed at the boundary of the first memory cell group and the second memory cell group so that the operation error due to the hot-carrier does not occur at the memory cell for storing data, and controls the voltage applied to the first and the second dummy lines BSL_H and BSL_L of the first and the second dummy elements during the first erase operation or the second erase operation.

More particularly, the semiconductor memory device of an embodiment of the present invention applies the erase operation voltage of 0V to the first dummy line BSL_H of the first dummy element adjacent to the first memory cell group during the first erase operation as shown in Table 2, and floats the second dummy line BSL_L of the second dummy element adjacent to the second memory cell group. Here, the first sub-dummy pass transistor is turned on, and the second sub-dummy pass transistor is turned off. Accordingly, the operation error due to the hot-carrier does not occur at the second memory cell group but occur at the second dummy element connected to the floated second dummy line BSL_L, and thus the semiconductor memory device of an embodiment of the present invention may reduce a probability of the operation error of the memory cell.

The erase operation voltage of 0V is applied to the second dummy line BSL_L of the second dummy element connected to the second memory cell group during the second erase operation, and the first dummy line BSL_H of the first dummy element connected to the first memory cell group is floating, which is not shown in Table 2. Here, the second sub-dummy pass transistor is turned on, and the first sub-dummy pass transistor is turned off. Accordingly, the operation error due to the hot-carrier does not occur at the first memory cell group but occur at the first dummy element connected to the floated first dummy line BSL_H, and thus the semiconductor memory device of an embodiment of the present invention may reduce the probability of the operation error of the memory cell.

The semiconductor memory device of an embodiment of the present invention applies the program voltage to the word line Sel WL connected to the memory cell selected from the first and the second memory cell group to perform the program operation, and applies the pass voltage Vpass to the other word lines Unsel WL. Moreover, the semiconductor memory device of an embodiment of the present invention applies a turn-on voltage Vpass' to the first dummy line BSL_H and the second dummy line BSL_L to turn on the first dummy element and the second dummy element during the program operation, and the first memory cell group and the second memory cell group may be connected to each other.

The semiconductor memory device of an embodiment of the present invention applies the read voltage to the word line Sel WL connected to the memory cell selected from the first and the second memory cell group to perform the read operation, and applies the pass voltage Vpass to the other word lines Unsel WL. In addition, the semiconductor memory device applies the turn-on voltage Vpass' to the first dummy line BSL_H and the second dummy line BSL_L to turn on the first dummy element and the second dummy element during the read operation, and the first memory cell group and the second memory cell group may be connected to each other.

The first and the second dummy lines BSL_H, BSL_L of the memory cell group not selected are floating during the erase operation, which is not shown in Table 2.

Figure 5:
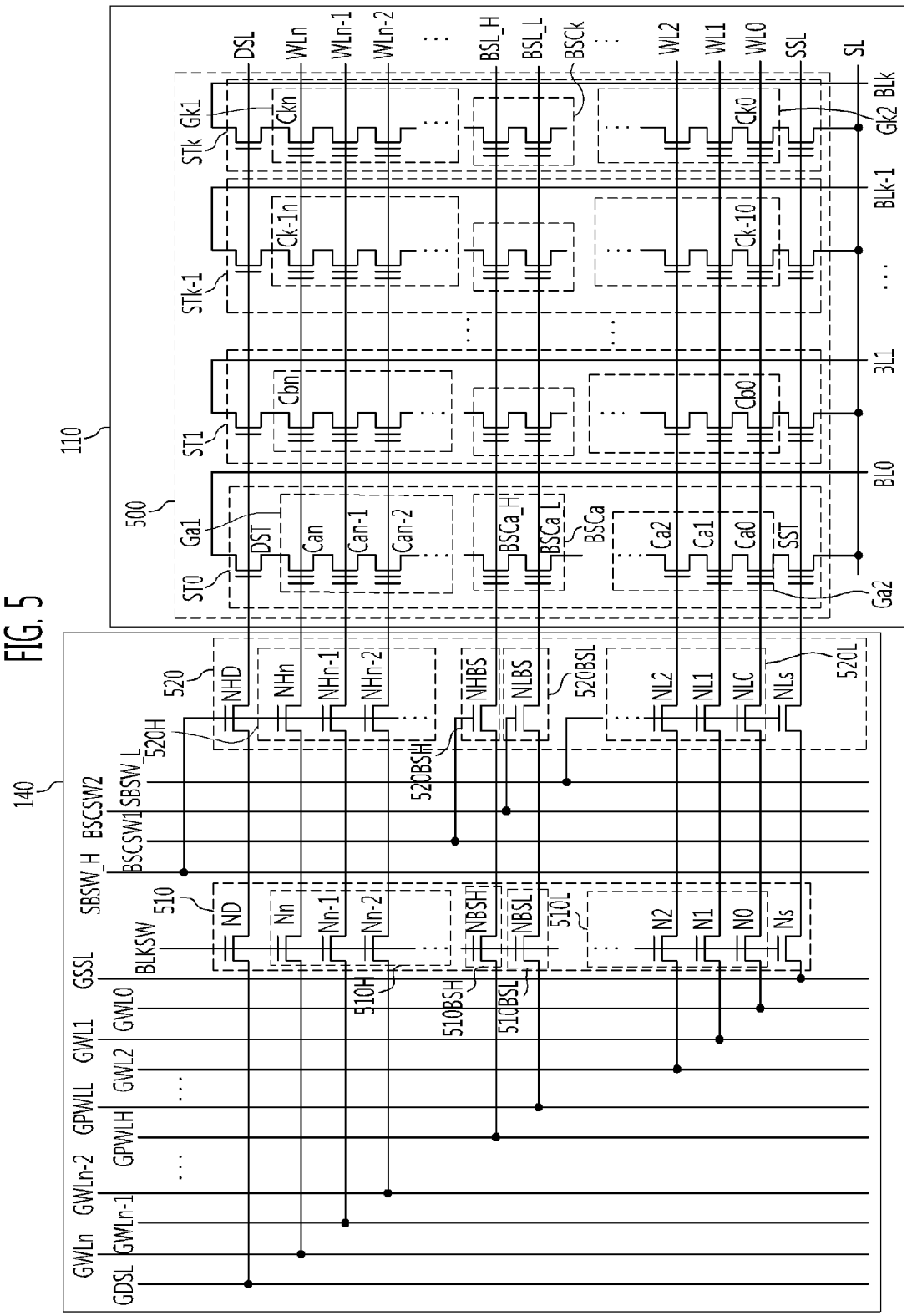
FIG. 5 is a view illustrating circuit for describing configuration of a row decoder and a memory block in a semiconductor memory device according to an embodiment of the present invention.

FIG. 5 is a view illustrating circuit for describing configuration of a row decoder and a memory block in a semiconductor memory device according to an embodiment of the present invention.

In FIG. 5, each of memory blocks 500 included in a memory array 110 of the semiconductor memory device according to an embodiment of the present invention includes the same elements as the memory block 400 in FIG. 4.

A row decoder 140 according to an embodiment of the present invention includes a block switch 510 and a sub-block switch 520 connected between global lines GSSL, GWL[0:n], GPWLL, GPWLH and GDSL and local lines SSL, WL[0:n], BSL_L, BSL_H and DSL.

The block switch 510 includes a drain pass transistor ND, a first select circuit 510H, dummy select circuits 510BSH and 510BSL, a second select circuit 510L and a source pass transistor Ns, and outputs operation voltages provided through the global lines GSSL, GWL[0:n], GPWLL, GPWLH, GDSL in response to a block select signal BLKSW.

The sub-block switch 520 provides the operation voltages outputted from the block switch 510 to local lines DSL, WL[n:0], BSL_H, BSL_L and SSL. More particularly, the sub-block switch 520 may provide the operation voltages outputted from the block switch 510 to the local lines DSL, WL[n:0], BSL_H, BSL_L and SSL using a sub-drain pass transistor NHD, a first sub-select circuit 520H, a first sub-dummy select circuit 520BSH, a second sub-dummy select circuit 520BSL, a second sub-select circuit 520L and a sub-source pass transistor NLS. Configuration and operation of the sub-drain pass transistor NHD, according to an embodiment of the present invention, the first sub-select circuit 520H, the second sub-select circuit 520L and the sub-source pass transistor NLS are the same as the embodiment described above. The first sub-dummy select circuit 520BSH provides the operation voltage of the first global dummy line GPWLH outputted from the dummy select circuit 510BSH to a first dummy line BSL_H connected to a first dummy element in response to a first sub-dummy select signal BSCSW1. Here, the first sub-dummy select circuit 520BSH may include a first sub-dummy pass transistor NHBS which is connected between the dummy select circuit 510BSH and the first dummy line BSL_H and operates in response to the first sub-dummy select signal BSCSW1. The second dummy select circuit 520BSL provides the operation voltage of the second global dummy line GPWLL outputted from the dummy select circuit 510BSL to a second dummy line BSL_L connected to a second dummy element in response to a second sub-dummy select signal BSCSW2. Here, the second sub-dummy select circuit 520BSL may include a second sub-dummy pass transistor NLBS which is connected between the dummy select circuit 510BSL and the second dummy line BSL_L and operates in response to the second sub-dummy select signal BSCSW2. Accordingly, the semiconductor memory device of an embodiment of the present invention may control differently the operation of the first and the second sub-dummy pass transistors NHBS and NLBS using the first and the second sub dummy select signal BSCSW1 and BSCSW2, respectively.

The semiconductor memory device according to an embodiment of the present invention may select the word lines WLn, WLn-1, WLn-2, . . . of a first memory cell group by using the first select circuit 510H of the block switch 510 and the first sub-select circuit 520H of the sub-block switch 520. The semiconductor memory device of an embodiment of the present invention may select the first dummy element BSCa_H using the dummy select circuit 510BSH of the block switch 510 and the first sub-dummy select circuit 520BSH of the sub-block switch 520, and select the second dummy element BSCa_L using the dummy select circuit 510BSL of the block switch 510 and the second sub-dummy select circuit 520BSL of the sub-block switch 520. In addition, the semiconductor memory device may select word lines WL0, WL1, WL2, . . . of a second memory cell group using the second select circuit 510L of the block switch 510 and the second sub-select circuit 520L of the sub-block switch 520.

In addition, the sub-block switch 520 applies an erase operation voltage provided from the block switch 510 to a selected memory cell group and a selected dummy element during an erase operation, and floats word lines of a memory cell group not selected and a dummy line connected to a dummy element not selected.

The sub-drain pass transistor NHD of the sub-block switch 520 and pass transistors NHn, NHn-1, NHn-2, . . . of the first sub-select circuit 520H are turned off during an operation in which the memory block 500 is not selected, and are turned on during an operation in which the memory block 500 is selected for a read operation or a program operation.

In a first erase operation of the first memory cell group, the semiconductor memory device selects the word lines WLn, WLn-1, WLn-2, . . . of the first memory cell group and applies an erase operation voltage to the selected word lines WLn, WLn-1, WLn-2, . . . of the first memory cell group, and floats the word lines WL0, WL1, WL2, . . . of the second memory cell group not selected. Additionally, In a second erase operation, the semiconductor memory device selects the word lines WL0, WL1, WL2, . . . of the second memory cell group and applies the erase operation voltage to the selected word lines WL0, WL1, WL2, . . . of the second memory cell group, and floats the word lines WLn, WLn-1, WLn-2, . . . of the first memory cell group not selected.

The first and the second sub-dummy pass transistors NHBS and NLBS are turned off during an operation in which the memory block 500 is not selected, and are turned on during an operation in which the memory block 500 is selected for the read operation or the program operation. The first sub-dummy pass transistor NHBS is turned on during an operation in which the first memory cell group is selected for the purpose of performing a first erase operation of the first memory cell group, and is turned off during an operation in which the second memory cell group is selected for the purpose of performing a second erase operation of the second memory cell group. The second sub-dummy pass transistor NLBS is turned off during an operation in which the first memory cell group is selected for the purpose of performing the first erase operation of the first memory cell group, and is turned on during an operation in which the second memory cell group is selected for the purpose of performing the second erase operation of the second memory cell group. Accordingly, the first dummy element BSCa_H adjacent to the selected first memory cell group is selected in the first erase operation, and the same erase operation voltage as the erase operation voltage provided to the first memory cell group is applied to the first dummy element BSCa_H. The second dummy element BSCa_L adjacent to the second memory cell group not selected is not selected in the first erase operation, and the second dummy line BSL_L is floating like the word lines of the second memory cell group. Whereas, the second dummy element BSCa_L adjacent to the selected second memory cell group is selected in the second erase operation, and the same erase operation voltage as the erase operation voltage provided to the second memory cell group is applied to the second dummy element BSCa_L. The first dummy element BSCa_H adjacent to the first memory cell group not selected is not selected in the second erase operation, and the first dummy line BSL_H is floating like the word lines of the first memory cell group.

The program operation and the read operation of the semiconductor memory device of an embodiment of the present invention are the same as in the embodiment described above. The semiconductor memory device of an embodiment of the present invention divides also the memory cells in the memory block into the first memory cell group and the second memory cell group, and then performs separately the first erase operation and the second erase operation. Accordingly, since the number of the memory cells erased in the memory block is limited in the range limited by the control circuit though physical number of the memory cells in the memory block increases, it is possible to achieve more highly integrated semiconductor memory.

In an embodiment of the present invention, the dummy elements are arranged at a boundary between the memory cell groups. The semiconductor memory device of an embodiment of the present invention selects the dummy element adjacent to the selected memory cell group and applies the erase operation to the selected dummy element during the erase operation of the selected memory cell group, and floats the dummy line connected to the dummy element adjacent to the memory cell group not selected. As a result, hot-carrier is injected into the dummy element not the memory cell, and thus operation error may not occur at the memory cell.

Figure 6:
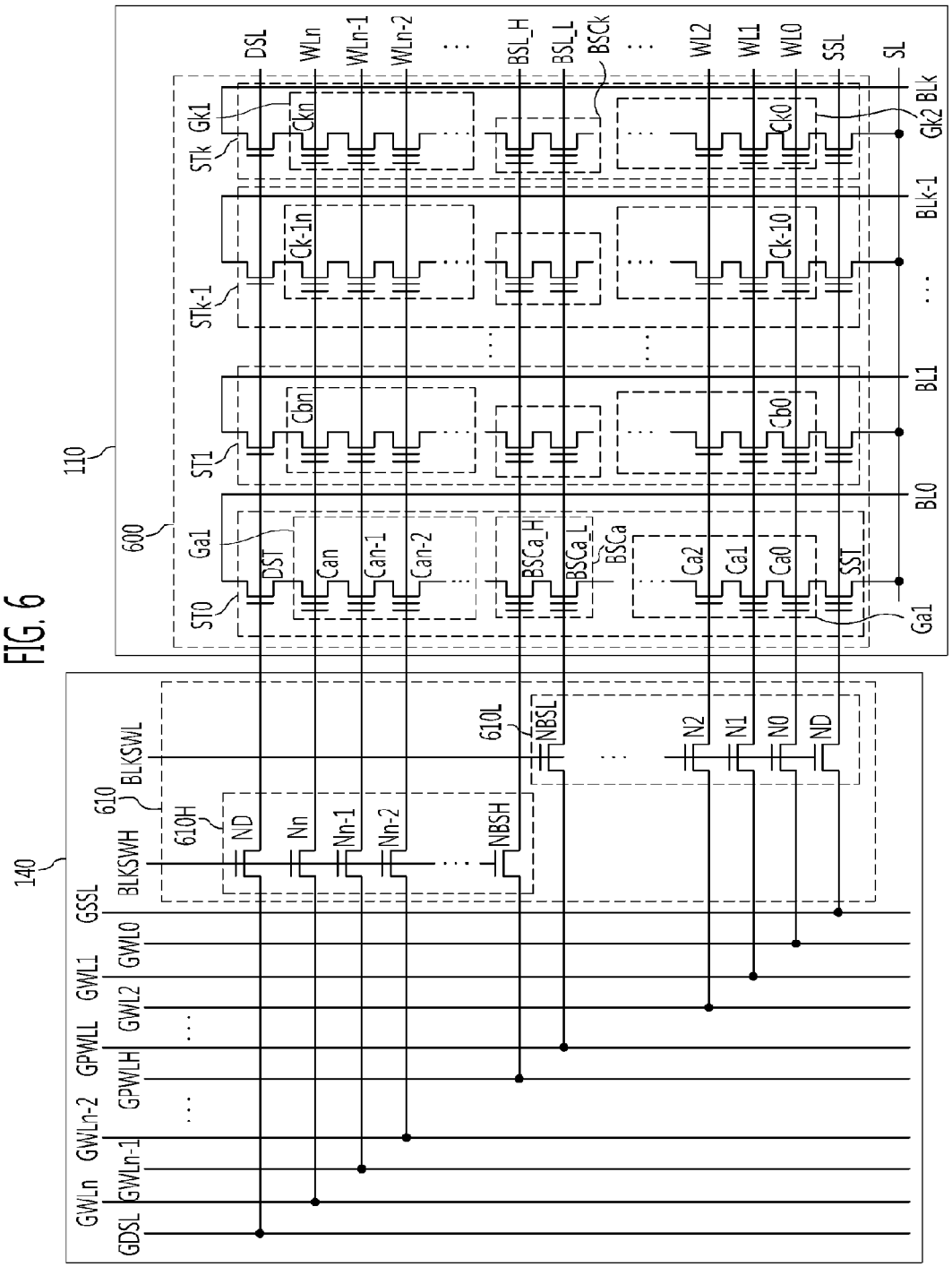
FIG. 6 is a view illustrating circuit for describing configuration of a row decoder and a memory block in a semiconductor memory device according to an embodiment of the present invention.

FIG. 6 is a view illustrating circuit for describing configuration of a row decoder and a memory block in a semiconductor memory device according to an embodiment of the present invention.

In FIG. 6, each of memory blocks 600 included in a memory array 110 of a semiconductor memory device of an embodiment of the present invention has the same elements as in the FIG. 4.

A row decoder 140 of an embodiment of the present invention includes a first block switch 610H and a second block switch 610L connected between global lines GSSL, GWL[0:n], GPWLL, GPWLH and GDSL and local lines SSL, WL[0:n], BSL_L, BSL_H and DSL.

The first block switch 610H applies operation voltages provided through a first global drain select line GDSL, a first global word line group GWLn, GWLn-1, GWLn-2, . . . and a first global dummy line GPWLH to a drain select line DSL of the memory block 600, word lines WLn, WLn-1, WLn-2, . . . of a first memory cell group and a first dummy line BSL_H in response to a first block select signal BLKSWH. The first block switch 610H includes a drain pass transistor ND connected between the global drain select line GDSL and the drain select line DSL, first pass transistors Nn, Nn-1, Nn-2, . . . connected between the first global word line group GWLn, GWLn-1, GWLn-2, . . . , and the word lines WLn, WLn-1, WLn-2, . . . , of the first memory cell group, and a first dummy pass transistor NBSH connected between the first global dummy line GPWLH and the first dummy line BSL_H of a first dummy element BSCa_H.

The second block switch 610L applies operation voltages provided through a second global source select line GSSL, a second global word line group GWL0, GWL1, GWL2, . . . , and a second global dummy line GPWLL to a source select line SSL of the memory block 600, word lines WL0, WL1, WL2, . . . , of a second memory cell group and a second dummy line BSL_L in response to a second block select signal BLKSWL. The second block switch 610L includes a source pass transistor NS connected between the global source select line GSSL and the source select line SSL, second pass transistors N0, N1, N2, . . . , connected between the second global word line group GWL0, GWL1, GWL2, . . . , and the word lines WL0, WL1, WL2, . . . , of the second memory cell group, and a second dummy pass transistor NBSL connected between the second global dummy line GPWLL and the second dummy line BSL_L of a second dummy element BSCa_L.

The pass transistors ND, N[n:0], NBSH, NBSL and NS of the first and the second block switch 610H and 610L are turned off during an operation in which the memory block 600 is not selected, and are turned on during an operation in which the memory block 600 is selected for the purpose of performing a program operation and a read operation. The pass transistors ND, Nn, Nn-1, Nn-2, . . . , NBSH included in the first block switch 610H are turned on during a first erase operation of the first memory cell group selected in the memory block 600, and the pass transistors NS, N0, N1, N2, . . . , NBSL included in the second block switch 610L are turned off during the first erase operation. Whereas, the pass transistors ND, Nn, Nn-1, Nn-2, . . . , NBSH include in the first block switch 610H are turned off during a second erase operation of the second memory cell group selected in the memory block 600, and the pass transistors NS, N0, N1, N2, . . . , NBSL included in the second block switch 610L are turned on during the second erase operation.

The semiconductor memory device according to an embodiment of the present invention divides the memory cells in the memory block into the first memory cell group and the second memory cell group, and then performs the erase operation in the unit of group. That is, the semiconductor memory device applies an erase operation voltage of 0V to the word lines of the first memory cell group during the first erase operation of the first memory cell group, and floats the word lines of the second memory cell group. In order to apply the erase operation voltage of 0V to the word lines of the first memory cell group and float the word lines of the second memory cell group during the first erase operation, the semiconductor memory device turns on the pass transistors of the first block switch and turns off the pass transistors of the second block switch. In addition, high voltage, e.g. 20V is applied to a well on a substrate of the memory cell array during the first erase operation. As a result, charges of the first memory cell group are discharged to the substrate due to voltage difference between the first memory cell group and the substrate during the first erase operation, and threshold voltage of the first memory cell group may become low to an erase level. Whereas, since the word lines of the second memory cell group are floating, a voltage of the word line of the second memory cell group increases due to coupling phenomenon in case that the high voltage is applied to the well, and the second memory cell group is not erased.

The semiconductor memory device according to an embodiment of the present invention applies an erase operation voltage of 0V to the word lines of the second memory cell group during the second erase operation of the second memory cell group, and floats the word lines of the first memory cell group. In order to apply the erase operation voltage of 0V to the word lines of the second memory cell group and float the word lines of the first memory cell group during the second erase operation, the semiconductor memory device turns on the pass transistors of the second block switch and turns off the pass transistors of the first block switch. Furthermore, high voltage, e.g. 20V is applied to the well on the substrate of the memory cell array during the second erase operation. As a result, charges of the second memory cell group are discharged to the substrate due to voltage difference between the second memory cell group and the substrate during the second erase operation, and threshold voltage of the second memory cell group may become low to the erase level. Whereas, since the word lines of the first memory cell group are floating, a voltage of the word line of the first memory cell group increases due to coupling phenomenon in case that the high voltage is applied to the well, and the first memory cell group is not erased.

The semiconductor memory device of an embodiment of the present invention divides the memory cells in the memory block into the first memory cell group and the second memory cell group, and then performs separately the first erase operation and the second erase operation. Accordingly, the number of the memory cells erased in the memory block may be adjusted in the range limited by the control circuit though physical number of the memory cells in the memory block increases, and thus it is possible to achieve more highly integrated semiconductor memory.

Since the pass transistors of the first block switch of an embodiment of the present invention are turned on during the first erase operation, the first dummy line controlled by the first block switch is selected and the erase operation voltage of 0V may be applied to the first dummy line. Since the pass transistors of the second block switch are turned off, the second dummy line controlled by the second block switch may not be selected but be floating.

Since the pass transistors of the second block switch of an embodiment of the present invention are turned on during the second erase operation, the second dummy line controlled by the second block switch is selected and the erase operation voltage of 0V may be applied to the second dummy line. Since the pass transistors of the first block switch are turned off, the first dummy line controlled by the first block switch may not be selected but be floating.

In an embodiment of the present invention, the dummy elements are arranged at a boundary between the memory cell groups of the semiconductor memory device. The semiconductor memory device selects the dummy element adjacent to the selected memory cell group and applies the erase operation to the selected dummy element during the erase operation of the selected memory cell group, and floats the dummy line connected to the dummy element adjacent to the memory cell group not selected. As a result, hot-carrier is injected into the dummy element not the memory cell, and thus the probability of the operation error of the memory cell may be reduced.

The voltage applied to the word lines of the memory block selected for the program operation or the read operation and the first and the second dummy lines is the same as in the embodiment described above.

Figure 7:
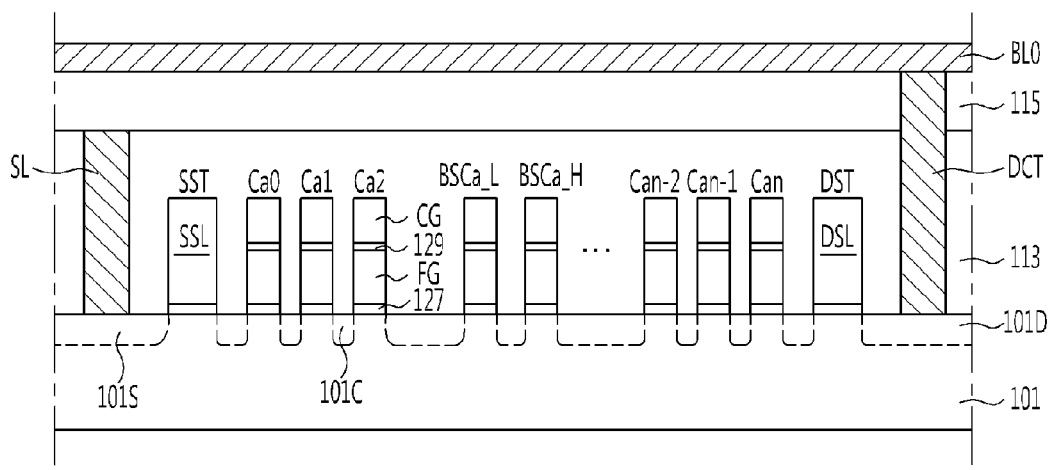
FIG. 7 is a sectional view illustrating schematically a memory cell string of the semiconductor memory device according to embodiments of the present invention.

FIG. 7 is a sectional view illustrating schematically a memory cell string of the semiconductor memory device according to embodiments of the present invention.

Each of memory cell strings in the semiconductor memory device of embodiments of the present invention includes the source select transistor SST connected to the common source line SL, the drain select transistor DST connected to the bit line BL0 and memory cells C[a0:an] connected in series between the source select transistor SST and the drain select transistor DST. Each of the memory cell strings includes further at least one dummy element BSCa_L, BSCa_H connected in series at a boundary of specific memory cells. The dummy element BSCa_L, BSCa_H is connected between the memory cells operating separately in the memory cell string during the erase operation.

Gate of the source select transistor SST is connected to the source select line SSL formed over a semiconductor substrate 101. The source select line SSL is formed on a gate insulating layer 127. Gate of the drain select transistor DST is connected to the drain select line DSL formed over the semiconductor substrate 101. The drain select line DSL is formed on the gate insulating layer 127. Each of the memory cells C[a0:an] comprises the gate insulating layer 127 used as tunnel insulating layer, a floating gate FG, a dielectric layer 129 and a control gate CG. Here, the gate insulating layer 127 is formed on the semiconductor substrate 101, and the floating gate FG is formed on the gate insulating layer 127, and the dielectric layer 129 is formed on the floating gate FG, and the control gate CG is formed on the dielectric layer 129. Each of the source select line SSL and the drain select line DSL may be formed by using the same layer as the control gate CG. Also, each of the source select line SSL and the drain select line DSL may be connected electrically to a lower layer, which is formed between the drain select line DSL and the gate insulating layer 27 and is formed by using the same layer as the floating gate FG, through the contact hole in the dielectric layer 29.

Gates of the dummy elements BSCa_L and BSCa_H may have the same stack structure as the memory cells C[a0:an] as shown in FIG. 7. The memory cell may be spaced from the dummy element BSCa_L or BSCa_H by 1 nm to 1000 nm, and the gate of the dummy element BSCa_L or BSCa_H may have length of 1 nm to 100 nm. Moreover, the dummy elements BSCa_L and BSCa_H may be controlled by applying a voltage of 0V to 25V.

In an embodiment of the present invention, the gates of the dummy element BSCa_L or BSCa_H may have the same stack structure as the source select transistor SST and the drain select transistor DST.

The source select transistor SST, the memory cells C[a0:an], the dummy elements BSCa_L and BSCa_H and the drain select transistor DST are connected in series through impurity areas 101S, 101C and 101D formed on the semiconductor substrate 101. The impurity areas includes a source area 101S of the memory cell string connected to the common source line SL, cell connection areas 101C formed between the gates of the source select transistor SST, the memory cells C[a0:an], the dummy elements BSCa_L and BSCa_H and the drain select transistor DST and a drain area 101D of a memory cell string connected to drain contact DCT. The drain area 101D may be connected to the bit line BL0 via the drain contact DCT. Insulating layers 113 and 115 are formed between patterns which need to be insulated.

Figure 8:
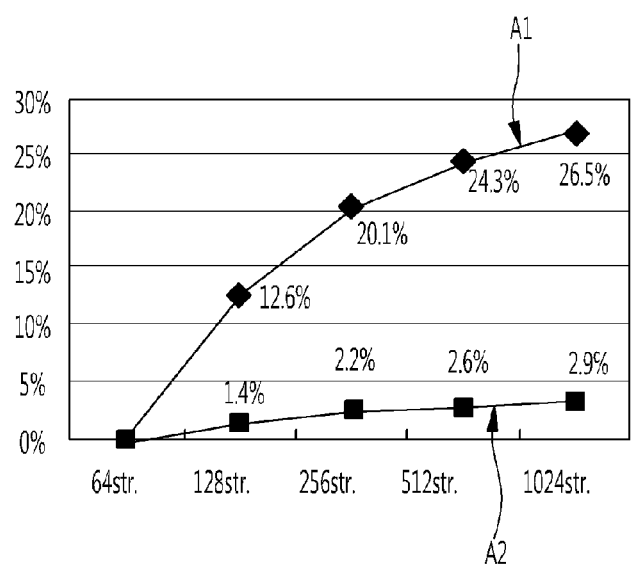
FIG. 8 is a view illustrating a graph showing the rate of increase of size of a memory block according as the number of memory cells in the memory cell string augments.

FIG. 8 is a view illustrating a graph showing the rate of increase of a memory block area according as the number of memory cells in the memory cell string increases. Referring to FIG. 8, it is verified that the rate of increase of the memory block area, in a case (A2) that the number of memory cells in the memory cell string increases and dummy elements having the same structure as the memory cell are formed repeatedly, decreases considerably compared to that in a case (A1) that the number of the memory cells in the memory cell string increases and select transistors are formed repeatedly without the dummy elements.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device comprising:
a memory array configured to have memory cell strings including a first memory cell group having memory cells connected in series; a second memory cell group having memory cells connected in series, wherein the second memory cell group is not selected in case that the first memory cell group is selected for an erase operation and the first memory cell group is not selected in case that the second memory cell group is selected for an erase operation; a first and a second dummy elements connected in series between the first memory cell group and the second memory cell group, wherein the first and the second dummy elements are configured to electrically connect the first memory cell group to the second memory cell group during a program operation or a read operation of a selected memory cell; and a drain select transistor and a source select transistor connected to the first memory cell group and the second memory cell group, wherein the first memory cell group and the second memory cell group are arranged between the drain select transistor and the source select transistor, wherein one of the first dummy element and the second dummy element adjacent to the memory cell group selected for an erase operation is selected during the erase operation of the memory cell group selected for an erase operation.

2. The semiconductor memory device of claim 1, further comprising:
  a first select circuit configured to output operation voltages provided through first global word lines in response to a block select signal;
  a first sub-select circuit configured to provide the operation voltages outputted from the first select circuit to word lines of the first memory cell group in response to a first sub-select signal;
  a dummy select circuit configured to output operation voltages provided through a first and a second global dummy lines in response to the block select signal;
  a sub-dummy select circuit configured to provide the operation voltage of the first global dummy line outputted from the dummy select circuit to the first dummy element in response to a sub-dummy select signal, and provide the operation voltage of the second global dummy line outputted from the dummy select circuit to the second dummy element in response to the sub-dummy select signal;
  a second select signal configured to output operation voltages provided through second global word lines in response to the block select signal; and
  a second sub-select circuit configured to provide the operation voltages outputted from the second select circuit to word lines of the second memory cell group in response to a second sub-select signal.

3. The semiconductor memory device of claim 1, further comprising:
  a first select circuit configured to output operation voltages provided through first global word lines in response to a block select signal;
  a first sub-select circuit configured to provide the operation voltages outputted from the first select circuit to word lines of the first memory cell group in response to a first sub-select signal;
  a dummy select circuit configured to output operation voltages provided through a first and a second global dummy lines in response to the block select signal;
  a first sub-dummy select circuit configured to provide the operation voltage of the first global dummy line outputted from the dummy select circuit to the first dummy element in response to a first sub-dummy select signal;
  a second sub-dummy select circuit configured to provide the operation voltage of the second global dummy line outputted from the dummy select circuit to the second dummy element in response to a second sub-dummy select signal;
  a second select signal configured to output operation voltages provided through second global word lines in response to the block select signal; and
  a second sub-select circuit configured to provide the operation voltages outputted from the second select circuit to word lines of the second memory cell group in response to a second sub-select signal.

4. The semiconductor memory device of claim 1, further comprising:
  a first block switch configured to apply an operation voltage provided through first global word lines to word lines of the first memory cell group in response to a first block select signal, and apply an operation voltage provided through a first global dummy line to the first dummy element in response to the first block select signal; and
  a second block switch configured to apply an operation voltage provided through second global word lines to word lines of the second memory cell group in response to a second block select signal, and apply an operation voltage provided through a second global dummy line to the second dummy element in response to the second block select signal.

5. The semiconductor memory device of claim 1, wherein the first dummy element and the second dummy element have the same stack structure as the memory cell.

6. The semiconductor memory device of claim 1, wherein the first dummy element and the second dummy element have the same stack structure as the drain select transistor and the source select transistor.

7. A method of operating a semiconductor memory device, the method comprising:
  providing a memory array having memory cell strings including a first and a second memory cell groups having memory cells connected in series, a first and a second dummy elements connected in series between the first memory cell group and the second memory cell group, a drain select transistor and a source select transistor connected to the first memory cell group and the second memory cell group, wherein the first memory cell group and the second memory cell group are arranged between the drain select transistor and the source select transistor;
  connecting electrically the first memory cell group to the second memory cell group by operation of the first dummy element and the second dummy element during a program operation or a read operation of the first memory cell group or the second memory cell group; and
  performing separately an erase operation of the first memory cell group and an erase operation of the second memory cell group in an erase operation of the memory array, selecting simultaneously one of the first dummy element and the second dummy element adjacent to a selected memory cell group during the erase operation of the selected memory cell group.

8. The method of claim 7, wherein one of the first dummy element and the second dummy element adjacent to a memory cell group not selected during the erase operation of the memory array is not selected.

9. The method of claim 7, wherein word lines of the first memory cell group are selected by a first select circuit for outputting operation voltages provided through first global word lines in response to a block select signal and a first sub-select circuit for providing the operation voltages outputted from the first select circuit to the word lines of the first memory cell group in response to a first sub-select signal.

10. The method of claim 7, wherein word lines of the second memory cell group are selected by a second select circuit for outputting operation voltages provided through second global word lines in response to a block select signal and a second sub-select circuit for providing the operation voltages outputted from the second select circuit to the word lines of the second memory cell group in response to a second sub-select signal.

11. The method of claim 7, wherein the first dummy element and the second dummy element are selected by a dummy select circuit and a sub-dummy select circuit, wherein the dummy select circuit is configured to output operation voltages provided through a first and a second global dummy lines in response to a block select signal, and wherein the sub-dummy select circuit is configured to provide the operation voltage of the first global dummy line outputted from the dummy select circuit to the first dummy element in response to a sub-dummy select signal and provide the operation voltage of the second global dummy line outputted from the dummy select circuit to the second dummy element in response to the sub-dummy select signal.

12. The method of claim 7, wherein the first dummy element is selected by a dummy select circuit for outputting operation voltages provided through a first and second global dummy lines in response to a block select signal and a first sub-dummy select circuit for providing the operation voltage of the first global dummy line outputted from the dummy select circuit to the first dummy element in response to a first sub-dummy select signal, and the second dummy element is selected by the dummy select circuit and a second sub-dummy select circuit for providing the operation voltage of the second global dummy line outputted from the dummy select circuit to the second dummy element in response to a second sub-dummy select signal.

13. The method of claim 7, wherein word lines of the first memory cell group and the first dummy element are selected by a first block switch which applies an operation voltage provided through first global word lines to the word lines of the first memory cell group in response to a first block select signal and applies an operation voltage provided through a first global dummy line to the first dummy element in response to the first block select signal, and word lines of the second memory cell group and the second dummy element are selected by a second block switch which applies an operation voltage provided through second global word lines to the word lines of the second memory cell group in response to a second block select signal and applies an operation voltage provided through a second global dummy line to the second dummy element in response to the second block select signal.

14. The method of claim 7, wherein an erase operation voltage is applied to word lines of the selected memory cell group and a dummy line of a selected dummy element during the erase operation of the memory array, and word lines of the memory cell group not selected and a dummy line of a dummy element not selected are floating.

15. The method of claim 14, wherein the erase operation voltage is 0V.

* * * * *